(12) United States Patent (10) Patent No.: US 7,554,150 B2
Min et al. (45) Date of Patent: Jun. 30, 2009

(54) NON-VOLATILE MEMORY DEVICE AND METHOD OF MANUFACTURING THE SAME

(75) Inventors: Hong-Kook Min, Yongin-si (KR); Yong-Suk Choi, Hwaseong-si (KR); Hyok-Ki Kwon, Yongin-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 222 days.

(21) Appl. No.: 11/749,998

(22) Filed: May 17, 2007

(65) Prior Publication Data

US 2008/0042186 A1 Feb. 21, 2008

(30) Foreign Application Priority Data

Jun. 19, 2006 (KR) .................. 10-2006-0054720

(51) Int. Cl.
*H01L 29/788* (2006.01)
*H01L 21/336* (2006.01)
(52) U.S. Cl. ............... 257/315; 257/314; 257/E21.209; 257/E21.682; 257/E29.129; 438/201; 438/257
(58) Field of Classification Search ................. 257/231, 257/314–323; 438/257, 201, 212, 593, 266
See application file for complete search history.

(56) References Cited

U.S. PATENT DOCUMENTS

| 2004/0075134 A1* | 4/2004 | Lin et al. ................... 257/324 |
| 2004/0077147 A1* | 4/2004 | Lin ............................ 438/259 |
| 2004/0171218 A1* | 9/2004 | Kim et al. .................. 438/266 |
| 2004/0207005 A1* | 10/2004 | Kim et al. .................. 257/315 |
| 2006/0099756 A1* | 5/2006 | Kwon ......................... 438/201 |

FOREIGN PATENT DOCUMENTS

| KR | 2003-78207 | 10/2003 |
| KR | 1020050055538 A | 6/2005 |
| KR | 1020060012982 A | 2/2006 |

* cited by examiner

*Primary Examiner*—Thanh V Pham
*Assistant Examiner*—Duy T Nguyen
(74) *Attorney, Agent, or Firm*—F. Chau & Assoc., LLC

(57) ABSTRACT

A non-volatile memory device includes isolation layers, a cell trench, a floating gate, a common source region and a word line. The isolation layers define an active region of a substrate. The cell trench is formed in the active region. The cell trench extends in a first direction. The floating gate is formed on the active region and in the cell trench. The common source region is formed on the active region adjacent a second side face of the floating gate and extends in a second direction substantially perpendicular to the first direction. The word line is formed on the active region, which is adjacent to a first side face of the floating gate opposite to the second side face, and the isolation layers and in the cell trench. The word line extends in the second direction.

17 Claims, 8 Drawing Sheets

NON-VOLATILE MEMORY DEVICE AND METHOD OF MANUFACTURING THE SAME

CROSS-REFERENCE TO RELATED APPLICATION

This application claims priority under 35 USC § 119 to Korean Patent Application No. 2006-54720 filed on Jun. 19, 2006, the contents of which are herein incorporated by reference in its entirety for all purposes.

BACKGROUND OF THE INVENTION

1. Technical Field

Exemplary embodiments of the present invention relate to a non-volatile memory device and a method of manufacturing the non-volatile memory device. More particularly, exemplary embodiments of the present invention relate to a non-volatile memory device including a split floating gate and a method of manufacturing the non-volatile memory device.

2. Discussion of Related Art

Generally, a semiconductor memory device is classified into a volatile memory device that loses data over time, and a non-volatile memory device for example, a flash memory that continuously maintains stored data, regardless of the passage of time.

The non-volatile memory device may include a memory cell having a stacked gate structure or a memory cell having a split gate structure.

A flash memory device widely used for the non-volatile memory device includes a plurality of memory cells arranged in a matrix pattern of rows and columns. The flash memory device electrically programs or reads data in a single memory array or at least two memory arrays in memory cells. On the other hand, the flash memory device simultaneously erases all of the memory arrays in the memory cells.

The flash memory device is a progressive type of an electrically erasable programmable read only memory (EEPROM) capable of rapidly erasing data. The flash memory device electrically controls input/output of data using Fowler-Nordheim (F-N) tunneling or hot electrons.

While programming data of the non-volatile memory device, a positive voltage applied to a word line, that is, a control gate, is coupled to a floating gate. Electrons are captured in the floating gate from a semiconductor substrate through a tunnel oxide layer by the F-N tunneling effect, or a hot earner injection, to program the data in the non-volatile memory device. On the other hand, while erasing data from the non-volatile memory device, the electrons in the floating gate escape to the semiconductor substrate by a negative voltage applied to the word line, or to the word line by a positive voltage applied to the word line.

As a design rule of the non-volatile memory device has been reduced, however, a size of the memory cell layout has been shrunk. This worsens the program efficiency of the non-volatile memory device operated in accordance with the above-mentioned conditions. Further, the program efficiency may be mainly dependent on the mobility of the hot electrons. Therefore, as a width of the word line making contact with the semiconductor substrate has been narrowed, the worsened program efficiency brings about reduction of a cell current.

Furthermore, in a non-volatile memory device having a split floating gate, an overlapped region between the split floating gate and a common source region has a very small area, so that a coupling ratio may be very low.

SUMMARY OF THE INVENTION

Exemplary embodiments of the present invention provide a non-volatile memory device that has a high program efficiency by enlarging the contact areas between a word line and an active region and between a split floating gate and the active region.

Exemplary embodiments of the present invention also provide a method of manufacturing the above-described non-volatile memory device.

A non-volatile memory device in accordance with an exemplary embodiment of the present invention includes isolation layers, a cell trench, a floating gate, a common source region and a word line. The isolation layers define an active region of a substrate, and the cell trench is formed in the active region of the substrate. Further, the cell trench extends in a first direction substantially in parallel with a lengthwise direction of the isolation layers. The floating gate is formed on the active region and in the cell trench. The common source region is formed on the active region adjacent a second side face of the floating gate and extends in a second direction substantially perpendicular to the first direction. The word line is formed on the active region, which is adjacent a first side face of the floating gate opposite to the second side face, and the isolation layers and in the cell trench. The word line extends in the second direction.

In a method of manufacturing a non-volatile memory device in accordance with an exemplary embodiment of the present invention, isolation layers are formed at a substrate to define an active region of the substrate. A cell trench, which extends in a first direction substantially parallel with a lengthwise direction of the isolation layers, is formed in the active region. A floating gate is formed on the active region and in the cell trench. A word line extending in a second direction substantially perpendicular to the first direction is formed on the active region, which is adjacent a first side face of the floating gate, and on the isolation layers and in the cell trench. A common source region extending in the second direction is formed on the active region adjacent a second side face of the floating gate opposite to the first side face.

According to an exemplary embodiment, the floating gate may be partially overlapped with the common source region and the isolation layers. Further, the floating gate may include a pair of floating gate patterns spaced apart along the first direction with respect to the common source region.

In an exemplary embodiment, the active region may include a first sub-region extending in a first direction and a second sub-region extending in a second direction. In this exemplary embodiment, the second sub-region may include the common source region doped with impurities. The common source region may be intersected with the cell trench extending along the first direction.

According to an exemplary embodiment, the non-volatile memory device may further include a funnel oxide layer having a uniform thickness formed between the active region having the cell trench and the floating gate. Further, the non-volatile memory device may include a gate insulation layer for insulating the floating gate and the word line.

In an exemplary embodiment, the word line may have a bottom face that partially makes contact with the active region having the cell trench adjacent the floating gate, the second side face of the floating gate, an upper face of the floating gate, and upper faces of the isolation layers. Further, after forming the word line, the active region adjacent the word line may be doped with impurities to form a drain region.

According to exemplary embodiments of the present invention, since the cell trench in the active region extends in the first direction, the word line and the floating gate in the active region is formed in the cell trench. That is, the word line and the floating gate three-dimensionally make contact with the active region having the cell trench. Therefore, a contact area of the word line with respect to the active region (that is, the injection area of the hot carriers) may be enlarged without increasing a design rule of the non-volatile memory device, so that a program efficiency of the non-volatile memory device may be improved. Further, a process margin of an overlapped portion between the split floating gate and the common source region may be sufficiently ensured.

BRIEF DESCRIPTION OF THE DRAWINGS

Exemplary embodiments of the present invention will be understood in more detail from the following descriptions taken in conjunction with the accompanying drawings wherein.

DESCRIPTION OF EXEMPLARY EMBODIMENTS

The present invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art.

Figure 1:
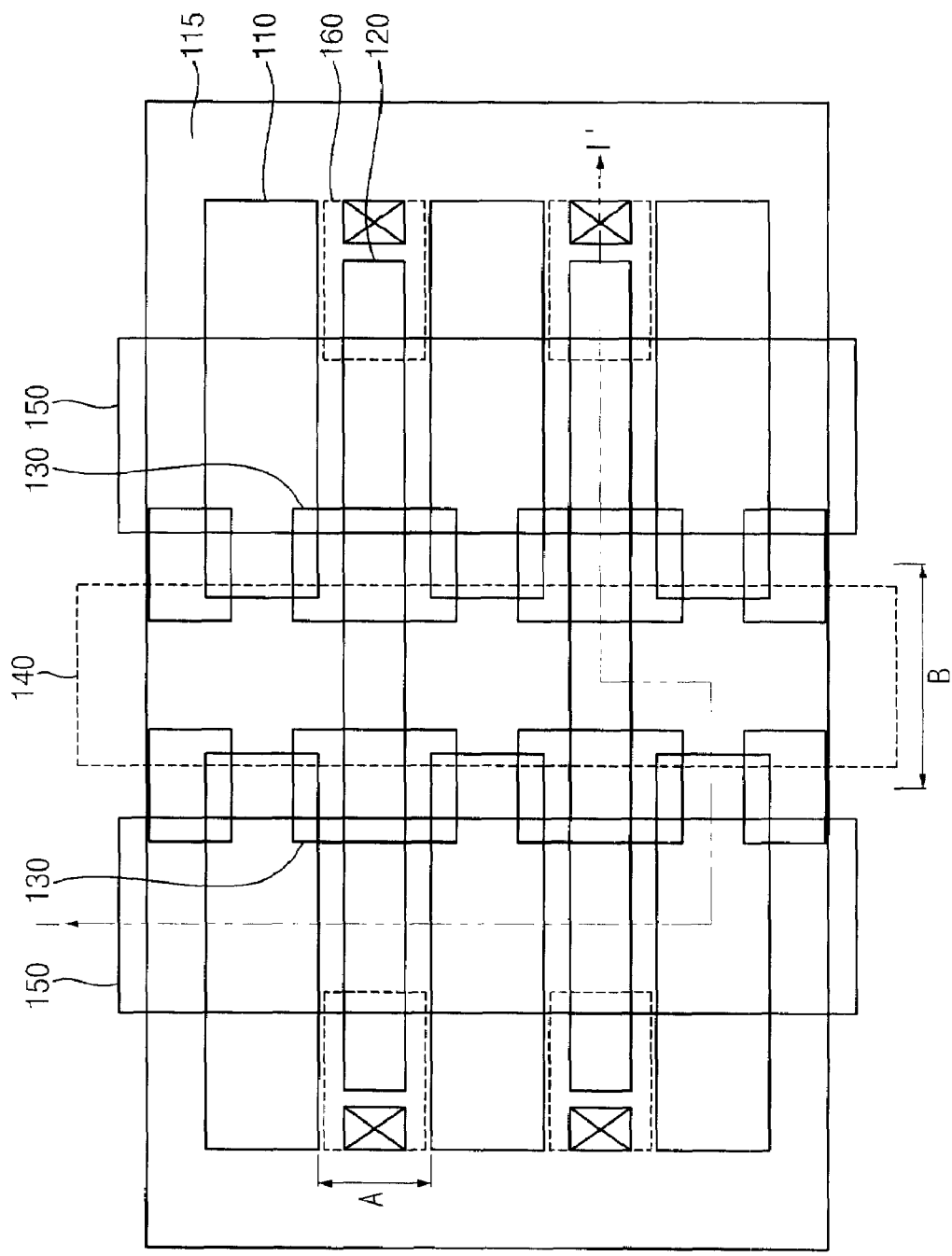
FIG. 1 is a plan view illustrating a layout of a non-volatile memory device in accordance with an exemplary embodiment of the present invention.
Figure 2:
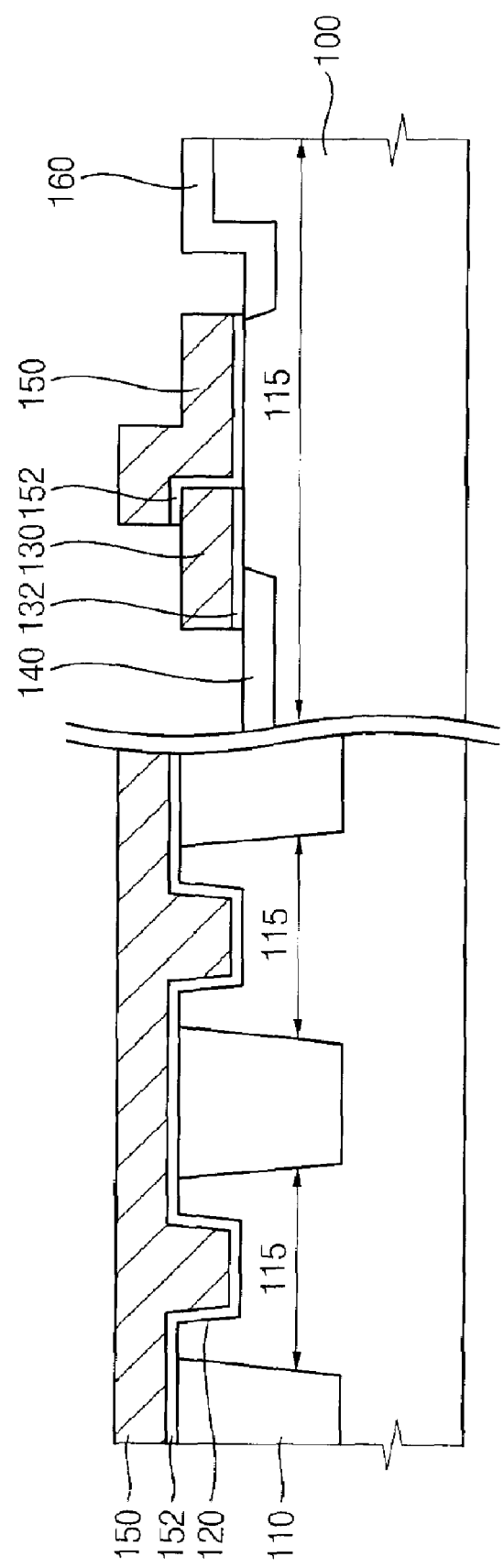
FIG. 2 is a cross-sectional view taken along a line I-I' in FIG. 1.

FIG. 1 is a plan view illustrating a layout of a non-volatile memory device in accordance with an exemplary embodiment of the present invention, and FIG. 2 is a cross-sectional view taken along a line I-I' in FIG. 1.

Referring to FIGS. 1 and 2, a non-volatile memory device of this exemplary embodiment includes a semiconductor substrate 100 having isolation layers 110, which are formed in the semiconductor substrate 100 to define an active region 115 of the semiconductor substrate 100, a cell trench 120 formed in the active region 115, a floating gate 130, a common source region 140, a word line 150 and a drain region 160. Further, the non-volatile memory device includes a tunnel oxide layer 132 formed between the active region 115 of the semiconductor substrate 100 and the floating gate 130. The non-volatile memory device also includes a gate insulation layer 152 formed between the floating gate 130 and the word line 150.

The isolation layers 110 are formed in the semiconductor substrate 100 to define the active region 115 and an isolation region of the semiconductor substrate 100. For example, the isolation layers 110 may be formed by a shallow trench isolation (STI) process. The isolation layers 110 are spaced apart from each other.

The cell trench 120, the floating gate 130, the common source region 140, and the drain region 160 are formed in the active region 115. More specifically, the active region 115 includes a first sub-region A extending in a first direction and a second sub-region B extending in a second direction substantially perpendicular to the first direction. The common source region B doped with impurities is formed in the second sub-region B.

The cell trench 120 is formed by etching the active region 115. For example, the cell trench 120 in the active region 115 extends along the first direction substantially parallel to a lengthwise direction of the isolation layers 110. Further, the cell trench 120 has a width narrower than that of the first sub-region A.

The floating gate 130 is formed in the active region 115 and in the cell trench 120. The floating gate 130 has a first side face and a second side face opposite to the first side face. More specifically, the floating gate 130 includes a pair of floating gate patterns spaced apart along the first direction with respect to the common source region 140. The floating gate 130 extends along the second direction. The floating gate 130 is partially overlapped with the common source region 140 and the isolation layers 110.

In this exemplary embodiment, a lower portion of the floating gate 130 is formed in the cell trench 120. Thus, contact areas between a bottom face of the floating gate 130 and the active region 115, and between the bottom face of the floating gate 130 and the common source region 140 are enlarged.

The tunnel oxide layer 132 insulates the floating gate 130 from the semiconductor substrate 100. The tunnel oxide layer 132 is formed between the floating gate 130 and the active region 115. Examples of the tunnel oxide layer 132 may include silicon oxide, silicon oxynitride, metal oxide, and the like. In this exemplary embodiment, silicon oxide is used for the tunnel oxide layer 132, and the tunnel oxide layer 132 is placed on the active region 115 having the cell trench 120.

The word line 150 is formed on the active region 115 and the isolation layers 110 to fill up the cell trench 120. That is, the word line 150 has a lower portion thereof in the cell trench 120. The word line 150 is positioned on the active region 115 adjacent the first side face of the floating gate 130 and the isolation layers 110.

Thus, the word line 150 has a bottom face that partially makes contact with the active region 115 having the cell trench 120 adjacent the floating gate 130, the first side face of the floating gate 130, an upper face of the floating gate 130, and upper faces of the isolation layers 110. In this exemplary embodiment, the word line 150 extends along the second direction. Since the lower portion of the word line 150 is formed in the cell trench 120, a contact area between the word line 150 and the active region 115 is enlarged.

The gate insulation layer 152 is formed on the floating gate 130 and the active region 115 to insulate the word line 150 from tire floating gate 130. That is, the gate insulation layer 152 is formed on the active region 115, and on the first side face and the upper face of the floating gate 130. Examples of the gate insulation layer 152 may include silicon oxide, silicon oxynitride, and the like.

The common source region 140 is formed in the active region 115. More specifically, the common source region 140 is formed in the second sub-region B adjacent the second side face of the floating gate 130. Therefore, the common source region 140 is partially overlapped with the floating gate 130. The common source region 140 has a linear shape that extends along the second direction and is intersected with the cell trench 120 extending along the first direction.

The drain region 160 is formed in the active region 115 adjacent the word line 150, and the drain region 160 is located opposite to the common source region 140. Further, the drain region 160 is partially overlapped with a bottom face of the word line 150. The drain region 160 is electrically connected to a bit line contact (not shown) formed by a following process. In this exemplary embodiment, the common source region 140 and the drain region 160 may be simultaneously formed.

According to this exemplary embodiment, since the word line is formed in the active region having a cell trench, the contact area (that is, the injection area of hot carriers) between the word line and the active region may be enlarged without increasing a design rule of the non-volatile memory device, so that the program efficiency of the non-volatile memory device may be improved. Further, a process margin of an overlapped portion between the split floating gate and the common source region may be sufficiently ensured.

Hereinafter, a method of manufacturing the non-volatile memory device is illustrated in detail according to an exemplary embodiment of the present invention.

FIGS. 3 to 8 are cross-sectional views illustrating a method of manufacturing the non-volatile memory device in FIG. 2.

Figure 3:
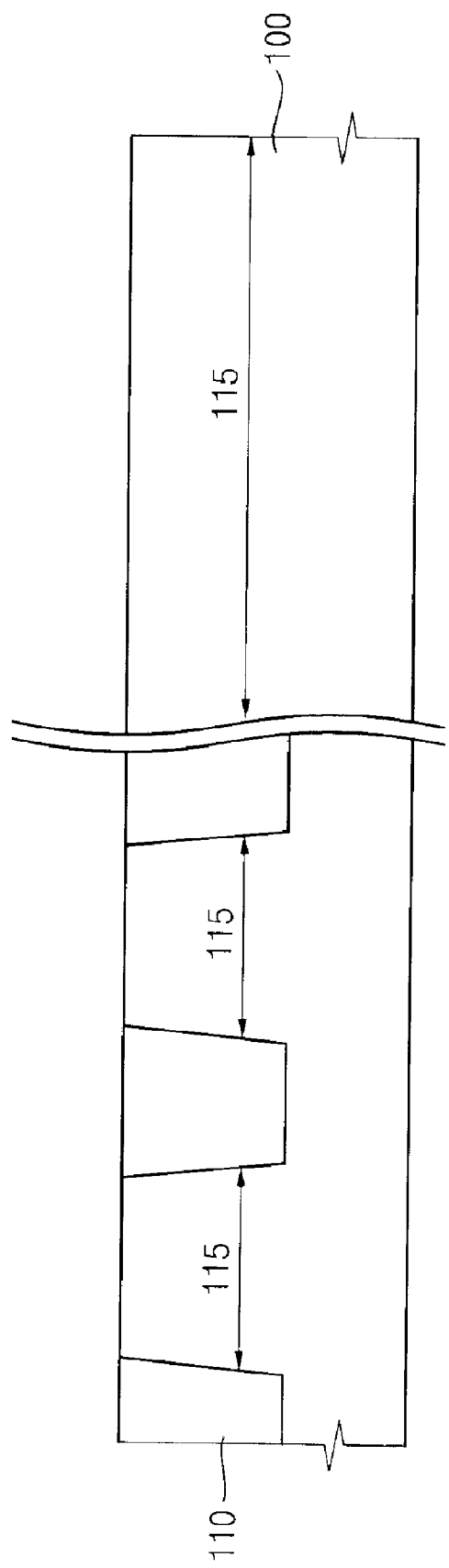
FIGS. 3 to 8 are cross-sectional views illustrating a method of manufacturing the non-volatile memory device in FIG. 2 according to an exemplary embodiment of the present invention.

Referring to FIG. 3, the isolation layers 110 are formed in the semiconductor substrate 100.

More specifically, a first mark pattern (not shown) is formed on the semiconductor substrate 100. In this exemplary embodiment, the first mask pattern may include a silicon nitride layer, a stacked structure having a silicon oxide layer, and a silicon nitride layer sequentially stacked, and so on. The silicon oxide layer corresponds to a pad oxide layer formed by a thermal oxidation process, or a chemical vapor deposition (CVD) process, and the like. The silicon nitride layer corresponds to a pad nitride layer formed by a low pressure CVD (LPCVD) process, a plasma enhanced CVD (PECVD) process using a $SiH_2Cl_2$ gas, a $SiH_4$ gas, an $NH_3$ gas, and the like.

The semiconductor substrate 100 is etched using the first mask pattern as an etching mask to form isolation trenches 120 at a surface portion of the semiconductor substrate 100.

For example, to cure damages in an inner wall of the isolation trenches 120 generated in forming the isolation trenches 120 of the semiconductor substrate 100, a sidewall oxide layer (not shown) may be further formed on the inner wall of the isolation trenches 120. The sidewall oxide layer may be formed by a thermal oxidation process. Further, to prevent foreign substances, which are generated in subsequent processes, from penetrating into the semiconductor substrate 100 through the inner wall of the isolation trenches 120, a liner layer (not shown) may be formed on the inner wall of the isolation trenches 120. The liner layer may be formed by a CVD process.

The isolation trenches 120 are fully filled with a silicon oxide layer (not shown). Examples of the silicon oxide layer may include boro-phosphor silicate glass (BPSG), phosphor silicate glass (PSG), undoped silicate glass (USG), spin-on-glass (SOG), plasma enhanced tetraethylorthosilicate (PE-TEOS), and the like. Further, to fully fill up the isolation trenches 120 with the silicon oxide layer, the silicon oxide layer may be formed using a material having good gap-filling characteristics by a spin coating process, a CVD process, and the like.

The first mask pattern is then removed. The silicon oxide layer is removed by a chemical mechanical polishing (CMP) process until an upper face of the semiconductor substrate 100 is exposed to form the isolation layers 110 in the isolation trenches 120. In this exemplary embodiment, the isolation layers 110 are spaced apart from each other.

The isolation layers 110 define the active regions 115 of the semiconductor substrate 100. The active region 315 corresponds to a region where the cell trench 120, the floating gate 130, the common source region 140 and the drain region 160 are formed. More specifically, the active region 115 includes the first sub-region extending along the first direction substantially parallel to the lengthwise direction of the isolation layers 110, and the second sub-region extending along the second direction.

Figure 4:
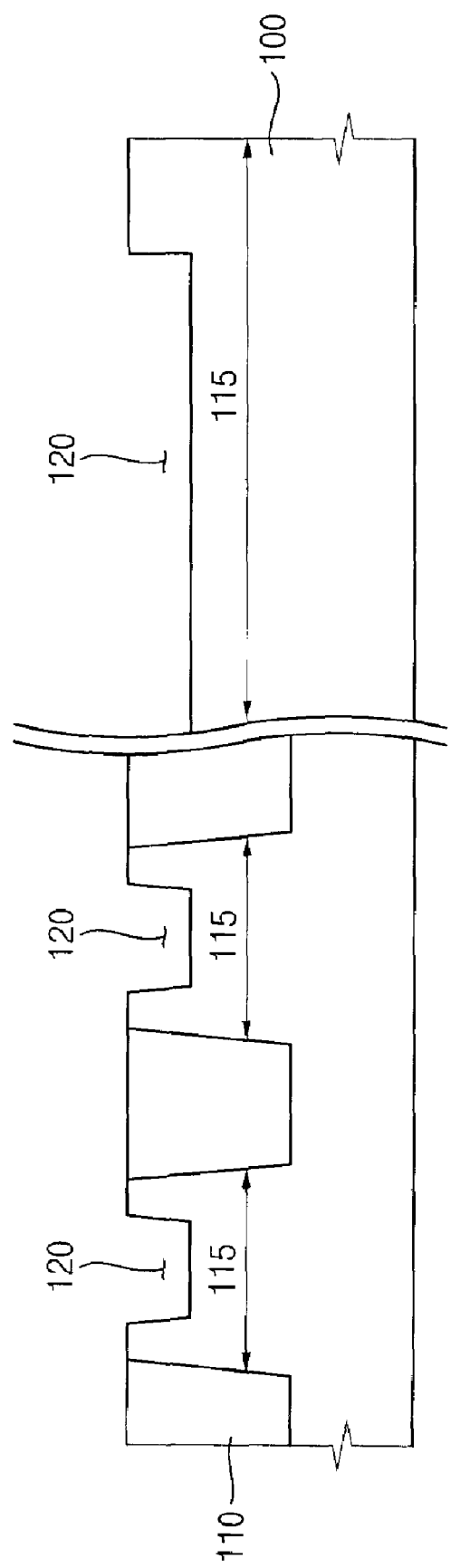

Referring to FIG. 4, a second mask pattern (not shown) is formed on the semiconductor substrate 100 and the isolation layers 110 to partially expose the active region 115. The second mask pattern may include a photoresist pattern or a nitride layer pattern having an opening for partially exposing the active region 115.

The active region 115 is etched using the second mask pattern as an etching mask to form the cell trench 120. In this exemplary embodiment, the cell trench 120 extends along the first direction and traverses the second sub-region. In addition, the cell trench 120 has a width that is narrower than that of the first sub-region.

The second mask pattern is then removed. For example, when the second mask pattern includes a photoresist pattern, the second mask pattern is removed by an ashing process and/or a stripping process using oxygen plasma. In contrast, when the second mask pattern includes the nitride layer pattern, the second mask pattern is removed by a cleaning process using a phosphoric acid solution.

Figure 5:
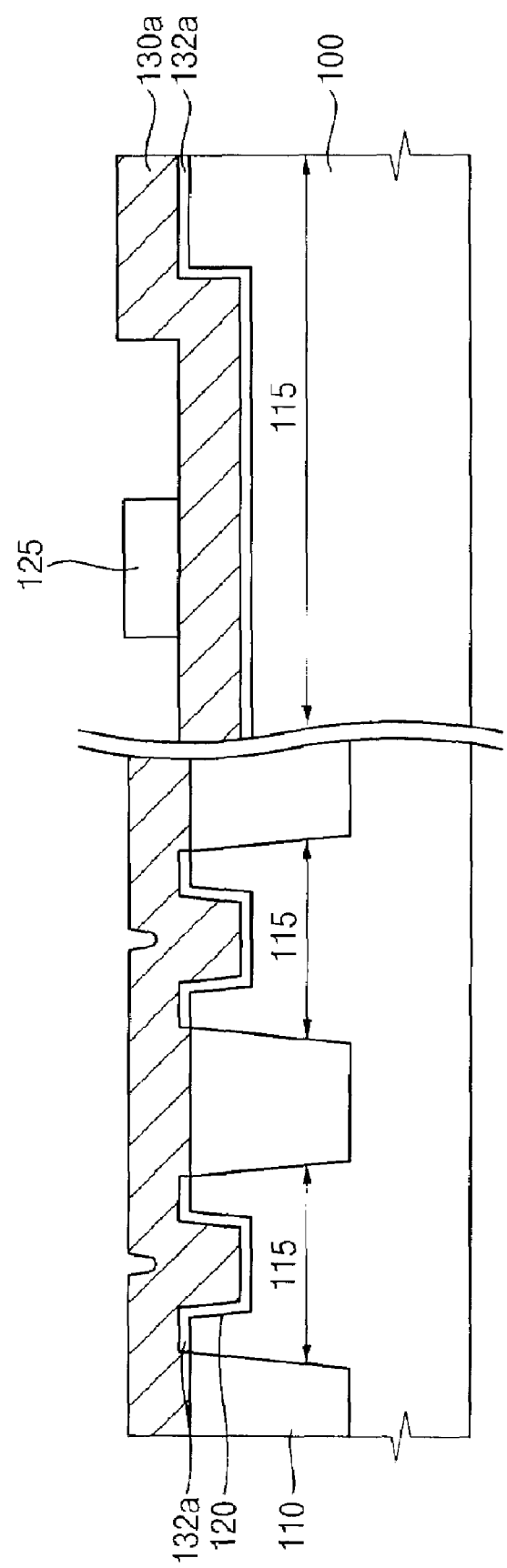

Referring to FIG. 5, a first oxide layer 132a is formed on the active region 115 and an inner face of the cell trench 120. Examples of the first oxide layer 132a may include silicon oxide, silicon oxynitride, metal oxide, and the like.

More specifically, when the first oxide layer 132a is formed of silicon oxide, the first silicon oxide layer 132a may be formed by a thermal oxidation process at a temperature of about 900° C. to about 1,200° C. In such thermal oxidation process, to prevent a temperature of the semiconductor substrate 100 from being rapidly changed, the semiconductor substrate 100 is slowly heated from room temperature to the above-mentioned oxidation temperature, which is in a range of about 900° C. to about 1,200° C. The thermal oxidation process is then carried out on the semiconductor substrate 100 at a temperature between about 900±1° C. to about 1,200±1° C. The semiconductor substrate 100 is then slowly cooled. Further, the thermal oxidation process may use an oxidizing agent, such as oxygen, water vapor, and the like. In this exemplary embodiment, the first oxide layer 132a may have a thickness of about 20 Å to about 80 Å, preferably 20 Å to about 70 Å, and more preferably 30 Å to about 60 Å.

As shown in FIG. 5, a first conductive layer 130a is formed on the first oxide layer 132a and the isolation layers 110. The first conductive layer 130a may include a polysilicon layer formed by a PECVD process. A third mask pattern 125 is then formed on the first conductive layer 130a to define a shape of the split floating gate 130, shown in FIG. 6. The third mask pattern 125 may include a photoresist pattern.

Figure 6:
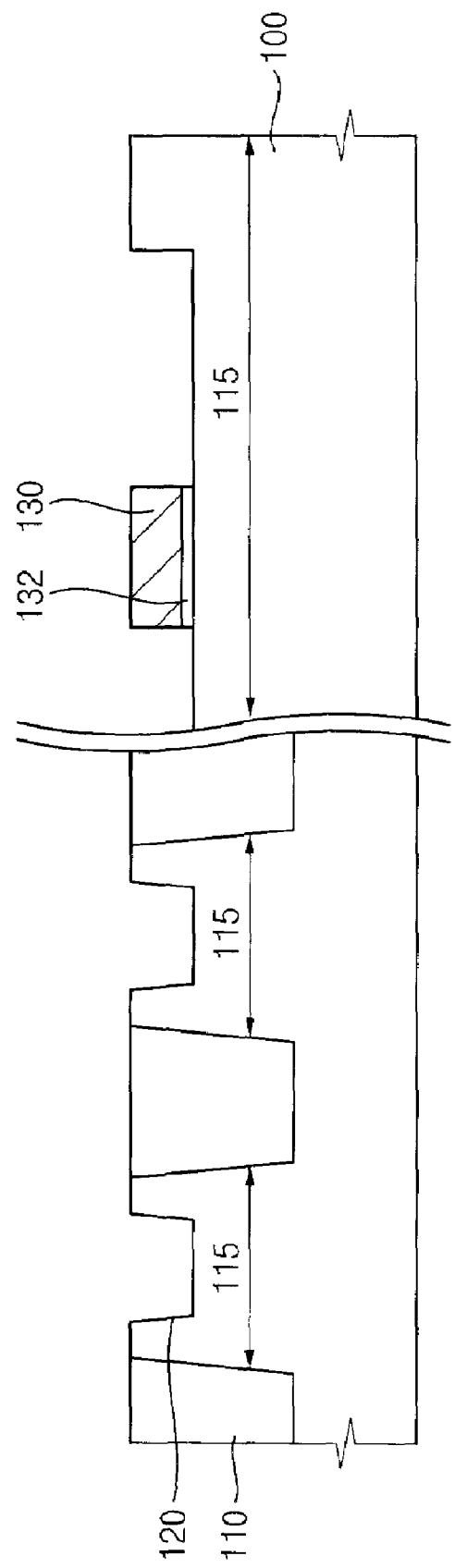

Referring to FIG. 6, the first conductive layer 130a and the first oxide layer 132a are dry-etched using the third mask pattern 125 as an etching mask to form the floating gate 130 and the tunnel oxide layer 132 on the active region 115. Subsequently, a portion of the first oxide layer 132a on the active region where the tunnel oxide layer 132 is not formed is removed.

As shown in FIG. 1, the floating gate 130 extends along the second direction in the active region 115, and the floating gate 130 is partially overlapped with the common source region 140 and the isolation layers 110. The floating gate 130 is at the lower portion in the cell trench 120 so that contact areas between the bottom face of the floating gate 130 and the active region 115, and contact areas between the bottom face of the floating gate 130 and the common source region 140, are enlarged.

The third mask pattern 125 is then removed from the floating gate 130. When the third mask pattern 125 includes the photoresist pattern, the third mask pattern 125 may be removed by an ashing process and/or a stripping process using oxygen plasma.

Figure 7:
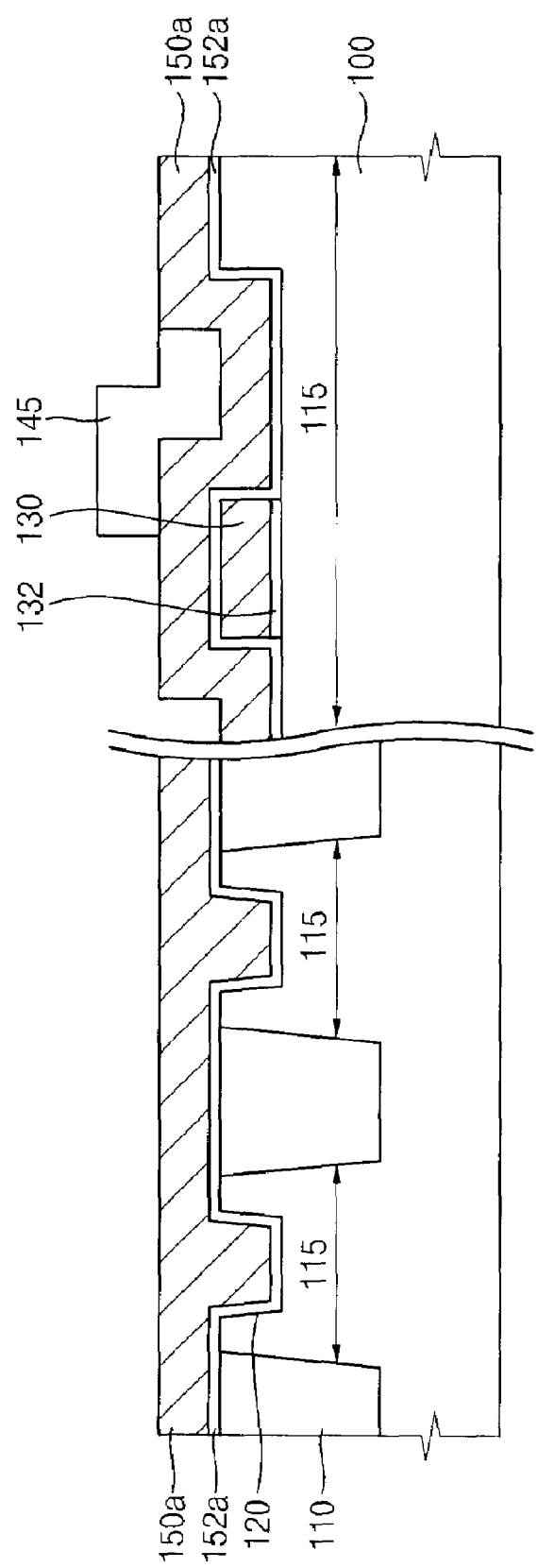

Referring to FIG. 7, a second oxide layer 152a is formed on the semiconductor substrate 100 and the floating gate 130. In this exemplary embodiment, the second oxide layer 152a may be formed by a thermal oxidation process, a CVD process, or the like. In this exemplary embodiment, the second oxide layer 152a is formed by the CVD process, and the second oxide layer 152a may include silicon oxide, silicon oxynitride, and the like. The second oxide layer 152a is used as a gate insulation layer for insulating between the floating gate 130 and the word line 150.

A second conductive layer 150a is formed on the second oxide layer 152a, and the second conductive layer 150a may be formed by an LPCVD process. A fourth mask pattern 145 for defining a shape of the word line 150 is formed on the second conductive layer 150a. In this exemplary embodiment, the fourth mask pattern 145 may include a photoresist pattern.

Figure 8:
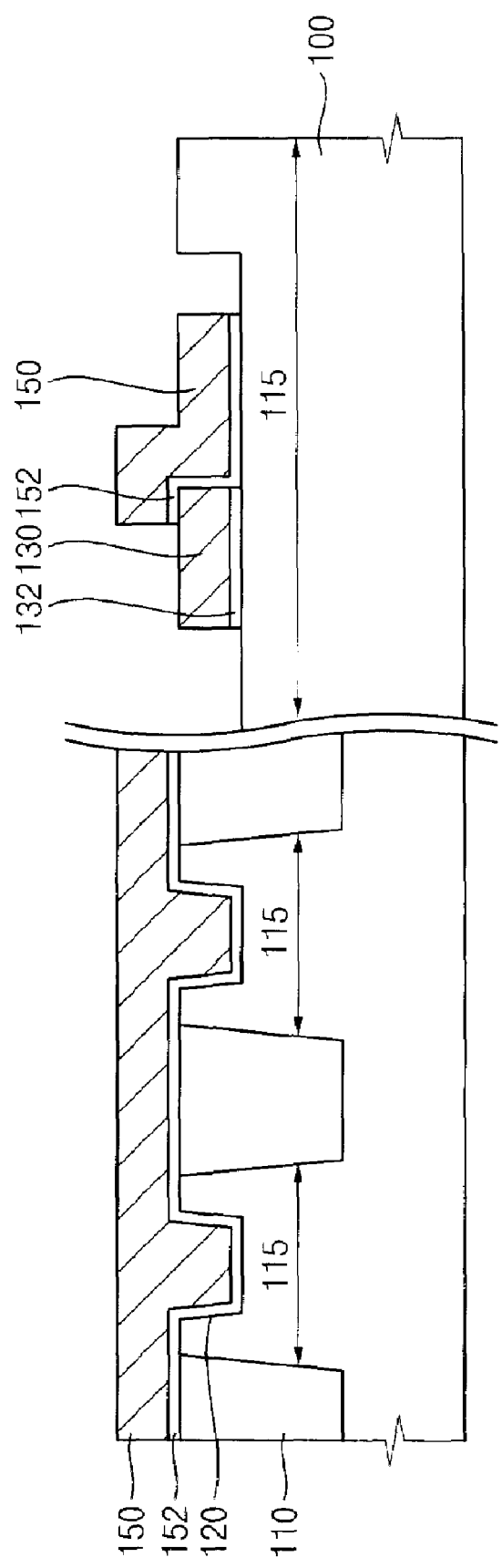

Referring to FIG. 8, the second conductive layer 150a and the second oxide layer 152a are dry-etched using the fourth mask pattern 145, shown in FIG. 7, as an etching mask to form the gate insulation layer 152 and the word line 150 on the semiconductor substrate 100. The gate insulation layer 152 is formed on the upper face of the active region 115, and the first side face and the upper face of the floating gate 130.

As shown in FIG. 1, the word line 150 is formed on the active region 115 and the isolation layers 110 and, the word line 150 is at the lower portion in the cell trench 120. More specifically, the word line 150 is formed on the active region 115 adjacent to the first side face of the floating gate 130 and the isolation layers 110. The word line 150 has a linear shape extending along the second direction on the semiconductor substrate 100.

More particularly the word line 150 has a bottom face that partially makes contact with the active region 115 having the cell trench 120 adjacent the floating gate 130, the first side face of the floating gate 130, the upper face of the floating gate 130, and the upper faces of the isolation layers 110. In this exemplary embodiment, since the word line 150 is at the lower portion in the cell trench 120, a contact area between the word line 150 and the active region 115 is enlarged. That is, the word line 150 three-dimensionally makes contact with the active region 115 having the cell trench 120, so that program efficiency of the non-volatile memory device may be improved without exceeding a design limitation of the non-volatile memory device.

The second mask pattern (not shown) is then removed from the word line 150 by an ashing process and/or a stripping process.

Impurities are implanted into the semiconductor substrate 100 using an ion implantation mask (not shown) to form the common source region 140 and the drain region 160. The ion implantation mask may include a photoresist pattern.

The common source region 140 is formed on the active region 115 adjacent the second face of the floating gate 130, and the common source region 140 is partially overlapped with the floating gate 130. For example, the common source region 140 has a linear shape that extends along the second direction and is intersected with the cell trench 120 extending along the first direction.

The drain region 160 is formed on the active region 115 adjacent the word line 150. For example, the drain region 160 is opposite to the common source region 140, and the drain region 160 is partially overlapped with the bottom face of the word line 150. The drain region 160 is electrically connected to a bit line contact (not shown) formed by a subsequent process. In this exemplary embodiment, the common source region 140 and the drain region 160 are simultaneously formed.

According to exemplary embodiments of the present invention, since the cell trench in the active region extends in the first direction, the word line and the floating gate in the active region are at the lower portions in the cell trench.

Thus, the word line and the floating gate three-dimensionally make contact with the active region having the cell trench. Therefore, a contact area of the word line with respect to the active region (that is, the injection area of the hot carriers) may be enlarged without exceeding a design rule of the non-volatile memory device, so that program efficiency of the non-volatile memory device may be improved. Further, a process margin of an overlapped portion between the split floating gate and the common source region may be sufficiently ensured.

Having described exemplary embodiments of the present invention, it is noted that modifications and variations can be made by persons of ordinary skill in the art in light of the above teachings. It is therefore to be understood that changes may be made in the exemplary embodiment of the present invention disclosed that are within the scope and the spirit of the invention outlined by the appended claims.

What is claimed is:

1. A non-volatile memory device comprising:
   a substrate having an active region that is defined by isolation layers;
   a cell trench formed at a surface portion of the active region of the substrate, the cell trench extending along a first direction substantially parallel with a lengthwise direction of the isolation layers;
   a floating gate formed on the active region to fill in the cell trench;
   a word line formed on the active region adjacent a first side face of the floating gate, and the isolation layers to fill up the cell trench, the word line extending along a second direction substantially perpendicular to the first direction; and
   a common source region formed in the active region adjacent a second side face of the floating gate that is opposite to the first side face, the common source region extending along the second direction.

2. The non-volatile memory device of claim 1, wherein the floating gate is partially overlapped with the common source region and the isolation layers.

3. The non-volatile memory device of claim 1, wherein the floating gate comprises a pair of floating gate patterns spaced apart in the first direction with respect to the common source region.

4. The non-volatile memory device of claim 1, wherein the active region comprises a first sub-region extending along the first direction and a second sub-region extending along the second direction, and the common source region is formed on the second sub-region.

5. The non-volatile memory device of claim 1, wherein the common source region is intersected with the cell trench.

6. The non-volatile memory device of claim 1, further comprising a tunnel oxide layer formed between the active region having the cell trench and the floating gate.

7. The non-volatile memory device of claim 1, wherein the word line is partially overlapped with the first side face and an upper face of the floating gate, and upper faces of the isolation layers.

8. The non-volatile memory device of claim 1, further comprising a gate insulation layer for insulating the floating gate from the word line.

9. The non-volatile memory device of claim 1, further comprising a drain region formed in the active region adjacent the word line.

10. A method of manufacturing a non-volatile memory device, comprising:

forming isolation layers in a substrate to define an active region of the substrate;

forming a cell trench at a surface portion of the active region, the cell trench extending along a first direction substantially parallel with a lengthwise direction of the isolation layers;

forming a floating gate on the active region to fill in the cell trench;

forming a word line on the active region adjacent a first side face of the floating gate and the isolation layers to fill up the cell trench, the word line extending along a second direction substantially perpendicular to the first direction; and forming a common source region in the active region adjacent a second side face of the floating gate that is opposite to the first side face, the common source region extending along the second direction.

11. The method of claim 10, wherein forming the cell trench comprises:

forming a mask pattern on the active region to partially expose the active region;

etching the active region using the mask pattern as an etching mask to form the cell trench; and removing the mask pattern.

12. The method of claim 10, further comprising forming a tunnel oxide layer on the active region having the cell trench.

13. The method of claim 10, wherein the floating gate is partially overlapped with the common source region and the isolation layers.

14. The method of claim 10, wherein forming the common source region comprises doping the active region adjacent to the first side face of the floating gate with impurities.

15. The method of claim 10, wherein the word line is partially overlapped with the first side face and an upper face of the floating gate, and upper faces of the isolation layers.

16. The method of claim 10, further comprising forming a gate insulation layer on the floating gate and the active region to insulate the floating gate from the word line.

17. The method of claim 1, further comprising doping the active region adjacent the word line with impurities to form a drain region, wherein the drain region is formed simultaneously with the common source region.

* * * * *